(12) United States Patent
Sun

(10) Patent No.: US 10,993,041 B2
(45) Date of Patent: Apr. 27, 2021

(54) MEMS MICROPHONE AND METHOD OF MANUFACTURING THE SAME

(71) Applicant: DB HITEK CO., LTD., Gangnam-gu Seoul (KR)

(72) Inventor: Jong Won Sun, Gyeonggi-do (KR)

(73) Assignee: DB HITEK CO., LTD., Seoul (KR)

( * ) Notice: Subject to any disclaimer, the term of this patent is extended or adjusted under 35 U.S.C. 154(b) by 182 days.

(21) Appl. No.: 16/056,863

(22) Filed: Aug. 7, 2018

(65) Prior Publication Data

US 2019/0052976 A1 Feb. 14, 2019

(30) Foreign Application Priority Data

Aug. 9, 2017 (KR) .................. 10-2017-0100995

(51) Int. Cl.
*H04R 19/04* (2006.01)
*B81B 3/00* (2006.01)
(Continued)

(52) U.S. Cl.
CPC ............ *H04R 19/04* (2013.01); *B81B 3/007* (2013.01); *B81C 1/00658* (2013.01); *H04R 7/04* (2013.01);
(Continued)

(58) Field of Classification Search
CPC . H04R 19/04; H04R 7/04; H04R 7/18; H04R 19/005; H04R 31/00; H04R 2201/003; B81B 3/007; B81B 2201/0257; B81B 2203/0127; B81B 2203/0307; B81C 1/00658; B81C 2201/0109; B81C 2201/0132
(Continued)

(56) References Cited

U.S. PATENT DOCUMENTS

| 6,535,460 | B2 | 3/2003 | Loeppert et al. |
| 7,362,873 | B2 | 4/2008 | Pedersen |
| 2006/0233401 | A1 | 10/2006 | Wang |
| 2007/0134839 | A1 | 6/2007 | Chang et al. |

(Continued)

FOREIGN PATENT DOCUMENTS

| KR | 1020080052222 A | 6/2008 |
| KR | 1020100073051 A | 7/2010 |

(Continued)

OTHER PUBLICATIONS

U.S. Appl. No. 16/056,840, filed Aug. 7, 2018, Inventor(s): Park et al.

*Primary Examiner* — Sean H Nguyen
(74) *Attorney, Agent, or Firm* — Patterson Thuente Pedersen, P.A.

(57) ABSTRACT

A MEMS microphone includes a substrate having a cavity, a back plate being disposed over the substrate and having a plurality of acoustic holes, a diaphragm disposed between the substrate and the back plate, the diaphragm being spaced apart from the substrate and the back plate, covering the cavity to form an air gap between the back plate, and being configured to generate a displacement with responding to an acoustic pressure and a plurality of anchors extending from an end portion of the diaphragm to be integrally formed with the diaphragm, the anchors being arranged along a circumference of the diaphragm to be spaced apart from each other, and having lower surfaces making contact with an upper surface of the substrate to support the diaphragm. Thus, the MEMS microphone may have improved rigidity and flexibility.

17 Claims, 10 Drawing Sheets

(51) Int. Cl.
*B81C 1/00* (2006.01)
*H04R 19/00* (2006.01)
*H04R 7/18* (2006.01)
*H04R 7/04* (2006.01)
*H04R 31/00* (2006.01)

(52) U.S. Cl.
CPC .............. *H04R 7/18* (2013.01); *H04R 19/005* (2013.01); *H04R 31/00* (2013.01); *B81B 2201/0257* (2013.01); *B81B 2203/0127* (2013.01); *B81B 2203/0307* (2013.01); *B81C 2201/0109* (2013.01); *B81C 2201/0132* (2013.01); *H04R 2201/003* (2013.01)

(58) Field of Classification Search
USPC ........................................................ 381/174
See application file for complete search history.

(56) References Cited

U.S. PATENT DOCUMENTS

| | | |
|---|---|---|
| 2010/0158279 A1 | 6/2010 | Conti et al. |
| 2011/0140215 A1 | 6/2011 | Sato |
| 2011/0227177 A1 | 9/2011 | Nakatani et al. |
| 2014/0374859 A1 | 12/2014 | Kasai |
| 2015/0375991 A1 | 12/2015 | Schelling et al. |
| 2016/0145095 A1 | 5/2016 | Tsai et al. |
| 2017/0212070 A1 | 7/2017 | Lee et al. |
| 2017/0234821 A1 | 8/2017 | Lee et al. |
| 2017/0311083 A1 | 10/2017 | Sun et al. |
| 2017/0311089 A1 | 10/2017 | Sun et al. |

FOREIGN PATENT DOCUMENTS

| | | |
|---|---|---|
| KR | 101462375 B1 | 11/2014 |
| KR | 101578542 B1 | 12/2015 |

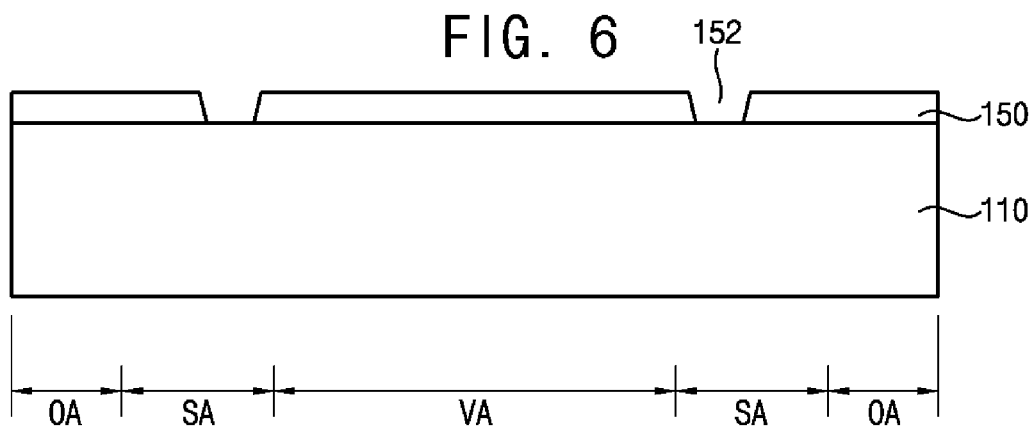
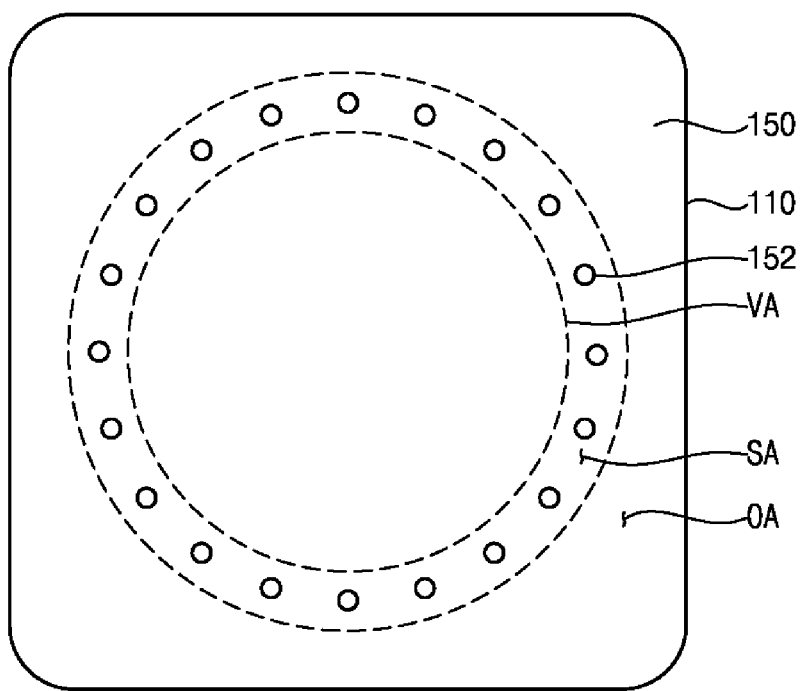

MEMS MICROPHONE AND METHOD OF MANUFACTURING THE SAME

CROSS-REFERENCE TO RELATED APPLICATION

This application claims priority to Korean Patent Application No. 10-2017-0100995, filed on Aug. 9, 2017 and all the benefits accruing therefrom under 35 U.S.C. § 119, the contents of which are incorporated by reference in their entirety.

TECHNICAL FIELD

The present disclosure relates to MEMS microphones capable of converting an acoustic wave into an electrical signal, and a method of manufacturing such MEMS microphones, and more particularly, to capacitive MEMS microphones being capable of transmitting signal related to an acoustic signal using a displacement which may be generated due to an acoustic pressure and a method of manufacturing such MEMS microphones.

BACKGROUND

Generally, a capacitive microphone utilizes a capacitance between a pair of electrodes which are facing each other to generate an acoustic signal. A MEMS microphone may be manufactured by a semiconductor MEMS process to have an ultra-small size.

The MEMS microphone may include a substrate including a cavity, a bendable diaphragm and a back plate which is facing the diaphragm. The diaphragm can be a membrane structure to generate a displacement due to the acoustic pressure. In particular, when the acoustic pressure is applied to the diaphragm, the diaphragm may be bent toward the back plate due to the acoustic pressure. The displacement of the diaphragm can be sensed through a change of capacitance between the diaphragm and the back plate. As a result, an acoustic wave can be converted into an electrical signal for output.

The MEMS microphone has a first insulation layer for spacing the diaphragm from the substrate, and a second insulation layer for spacing the diaphragm from the back plate. Portions of the first insulation layer and the second insulation layer, which are corresponding to the cavity, are removed so that the diaphragm can be freely bent with responding to the acoustic pressure. The diaphragm is supported by the first insulation layer, whereas the back plate is supported by the second insulation layer. The diaphragm may have a plurality of slits for providing a passage through which etchant flows to remove the portion of the second insulation layer, which is positioned between the back plate and the diaphragm during a manufacturing process of the MEMS microphone.

As described above, the conventional MEMS microphone may have a structure in which the diaphragm, the back plate, and the first and second insulation layer are flat in a thin film form. Therefore, a rigidity of the diaphragm may be relatively high, and it is easy to maintain the diaphragm flat. On the other hand, a flexibility of the diaphragm may be relatively low to lower a sensitivity of the diaphragm. In order to improve the flexibility of the diaphragm, when the diaphragm has a relatively large number of slits, the rigidity of the diaphragm may become deteriorated, and the diaphragm can be bent downwardly even in a standby state without an acoustic pressure applied to the diaphragm.

SUMMARY

The example embodiments of the present invention provide a MEMS microphone capable of improving both a rigidity and a flexibility of a diaphragm, and a method of manufacturing the MEMS microphone.

According to an example embodiment of the present invention, a MEMS microphone includes a substrate having a cavity, a back plate being disposed over the substrate and having a plurality of acoustic holes, a diaphragm disposed between the substrate and the back plate, the diaphragm being spaced apart from the substrate and the back plate, covering the cavity to form an air gap between the back plate, and being configured to generate a displacement in response to an applied acoustic pressure, and a plurality of anchors extending from an end portion of the diaphragm to be integrally formed with the diaphragm, the anchors being arranged along a circumference of the diaphragm to be spaced apart from each other, and having lower surfaces making contact with an upper surface of the substrate to support the diaphragm.

In an example embodiment, an empty space may be formed between the anchors adjacent to each other to provide a passage through which an applied acoustic pressure can pass.

In an example embodiment of the present invention, the MEMS microphone may further include an upper insulation layer covering the back plate and holding the back plate to space the back plate from the diaphragm such that the air gap is maintained.

In an example embodiment, the MEMS microphone may further include a strut being integrally formed with the upper insulation layer, the strut being provided on an outer side of the anchors and having a lower surface making contact with the upper surface of the substrate to support the upper insulation layer from the substrate such that the upper insulation layer is spaced apart from the diaphragm and the anchors.

In an example embodiment, the strut may be spaced from the diaphragm and the anchors, and the strut has a ring shape to surround a periphery of the diaphragm.

In an example embodiment, each of the anchors and the strut has a U-shaped vertical section.

In an example embodiment, the MEMS microphone may further include a lower insulation layer pattern located on the substrate and below the upper insulation layer, the lower insulation layer pattern having a material different from that of the upper insulation layer, a diaphragm pad disposed on the lower insulation layer pattern and connected to the diaphragm, a sacrificial layer pattern interposed between the lower insulation layer pattern and the upper insulation layer, the sacrificial layer pattern having a material different from that of the upper insulation layer, a back plate pad located on the sacrificial layer pattern and connected to the back plate, a first pad electrode disposed on the upper insulation layer to be electrically connected to the diaphragm pad, and a second pad electrode disposed on the upper insulating layer to be electrically connected to the back plate pad.

In an example embodiment, a first contact hole may be formed through the upper insulation layer and the sacrificial layer pattern to expose the diaphragm pad, and a second contact hole is formed the upper insulation layer to expose the back plate pad.

In an example embodiment, the diaphragm may include a doped portion disposed at a position corresponding to the back plate.

According to an example embodiment of the present invention, a MEMS microphone a substrate having a cavity, the substrate being divided into a vibration area, a supporting area surrounding the vibration area and a peripheral area surrounding the supporting area, a diaphragm disposed over the vibration area of the substrate to cover the cavity, the diaphragm being spaced apart from the substrate, and being configured to generate a displacement with responding to an acoustic pressure, a back plate disposed over the diaphragm and in the vibration area, the back plate being spaced apart from the diaphragm to form an air gap between the diaphragm and having a plurality of acoustic holes, and a plurality of anchors extending from the diaphragm toward the substrate, the anchors being disposed in the supporting area to be configured to support the diaphragm, and being arranged along a circumference of the vibration area to be spaced apart from each other.

In an example embodiment, wherein an empty space may be formed between the anchors adjacent to each other to provide a passage through which the acoustic pressure flows for communicating the cavity with the air gap.

In an example embodiment, the MEMS microphone may further include an upper insulation layer disposed over the substrate, the upper insulation layer being configured to hold the back plate.

In an example embodiment, the MEMS microphone may further include a strut positioned in the supporting area, the strut being provided at an outer side of the anchors and extending from a periphery of the upper insulation layer toward the substrate to support the upper insulation layer.

In an example embodiment, the strut may extend along a circumference of the vibration area.

In an example embodiment, the MEMS microphone may further include a lower insulation layer pattern located on the substrate and in the peripheral area, the lower insulation layer pattern being positioned under the upper insulation layer, and a sacrificial layer pattern in the peripheral area, the sacrificial layer pattern being interposed between the lower insulation layer pattern and the upper insulation layer.

According to an example embodiment of the present invention, a lower insulation layer is formed on a substrate being divided into a vibration area, a supporting area surrounding the vibration area, and a peripheral area surrounding the supporting area, the lower insulation layer is patterned to form a plurality of anchor holes in the supporting area for forming a plurality of anchors, the anchor holes being arranged along a circumference of the vibration area to be spaced apart from each other, a silicon layer is formed on the lower insulation layer through which the anchor holes are formed, the silicon layer is patterned to form a diaphragm and the anchors for supporting the diaphragm, a sacrificial layer is formed on the lower insulation layer to cover the diaphragm and the anchors, a back plate is formed on the sacrificial layer and in the vibration area, the back plate is patterned to form a plurality of acoustic holes which penetrates through the back plate, the substrate is patterned to form a cavity in the vibration area, and an etching process is performed using the cavity and the acoustic holes to remove portions of the sacrificial layer and the lower insulation layer, located at positions corresponding the vibration area and the supporting area.

In an example embodiment, removing the portions of the sacrificial layer and the lower insulation layer may include removing a portion of the lower insulation layer, located at a position corresponding to a portion between the anchors adjacent to each other, to form a passage through which an applied acoustic pressure can pass.

In an example embodiment, prior to forming the acoustic holes, the sacrificial layer and the lower insulation layer may be patterned to form a strut hole in the supporting region for forming a strut, and an insulating layer may be formed on the sacrificial layer on which the strut hole is formed to form an upper insulating layer for holding the back plate, and the strut for supporting the upper insulation layer.

In an example embodiment, in forming the strut hole, the strut hole may be formed to be spaced apart from the diaphragm and is formed at outer side of the anchors along the circumference of the vibration area.

In an example embodiment, the insulation layer may be made of a material different from those of the lower insulation layer and the sacrificial layer, and has an etching selectivity against the lower insulation layer and the sacrificial layer.

According to example embodiments of the present invention as described above, the MEMS microphone includes a plurality of anchors for supporting the diaphragm, such that the diaphragm is not supported by a thin film-like configuration such as a lower insulation layer. Further, the anchors may be provided integrally with the diaphragm, and an empty space may be formed between the anchors to provide a passage through which the acoustic pressure moves. Accordingly, the flexibility of the diaphragm can be remarkably improved without lowering the rigidity of the diaphragm, so that the sensitivity of the diaphragm can be improved and the diaphragm can be prevented from sagging.

In addition, the MEMS microphone includes the strut for supporting the back plate and the upper insulation layer, and the back plate and the upper insulation layer are not supported by a thin film-like configuration such as a sacrificial layer. Further, the strut may be provided integrally with the upper insulation layer, and is disposed apart from the diaphragm and the anchors. Accordingly, the MEMS microphone can further improve the flexibility of the diaphragm without reducing the rigidity of the diaphragm and the back plate.

Further, according to the embodiments of the present invention, since the anchors can be integrally formed with the diaphragm, it is not necessary to additionally perform a thin film deposition process and a process for patterning the thin film for forming the anchors.

In addition, since the method of manufacturing a MEMS microphone can form a strut integrally with an upper insulation layer, it is not necessary to additionally perform a thin film deposition process and a process of patterning the thin film for forming a strut. Moreover, while removing the lower insulation layer and the sacrificial layer in the vibration area and the supporting area, the strut can serve as a barrier layer to prevent the etchant from flowing into the peripheral region. As a result, the process margin can be secured and the yield of the production can be improved.

The above summary is not intended to describe each illustrated embodiment or every implementation of the subject matter hereof. The figures and detailed description that follow more particularly exemplify various embodiments.

BRIEF DESCRIPTION OF THE DRAWINGS

Example embodiments can be understood in more detail from the following description taken in conjunction with the accompanying drawings, in which:

FIGS. 6 and 8 to 17 are cross sectional views illustrating a method of manufacturing a MEMS microphone in accordance with an example embodiment of the present invention; and FIG. 7 is a plan view illustrating a lower insulation layer pattern in FIG. 6.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. By contrast, it will also be understood that when a layer, a film, a region or a plate is referred to as being 'directly on' another one, it is directly on the other one, and one or more intervening layers, films, regions or plates do not exist. Also, although terms such as a first, a second, and a third are used to describe various components, compositions, regions, films, and layers in various embodiments of the present invention, such elements are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. The Figures are not necessarily drawn to scale. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 1:
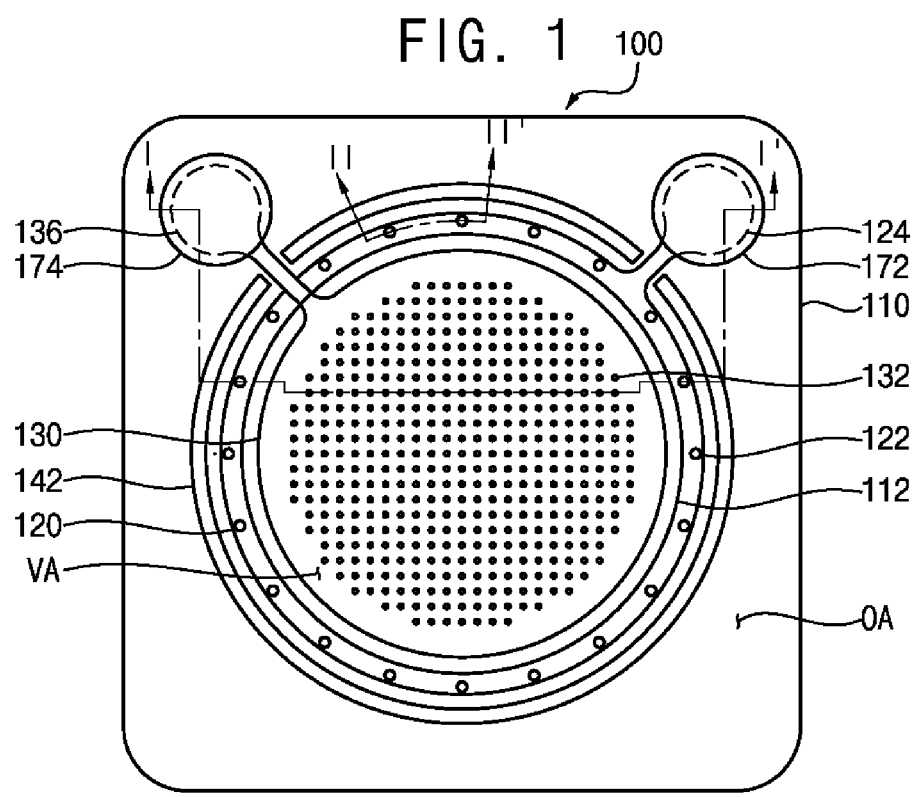
FIG. 1 is a plan view illustrating a MEMS microphone in accordance with an example embodiment of the present invention.
Figure 2:
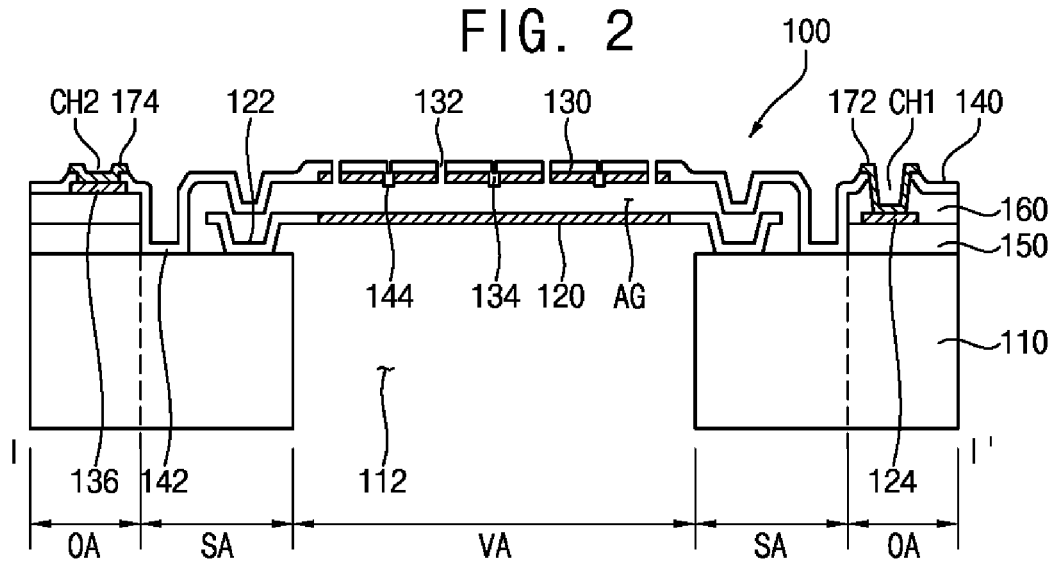
FIG. 2 is a cross sectional view taken along a line I-I' of FIG. 1.
Figure 3:
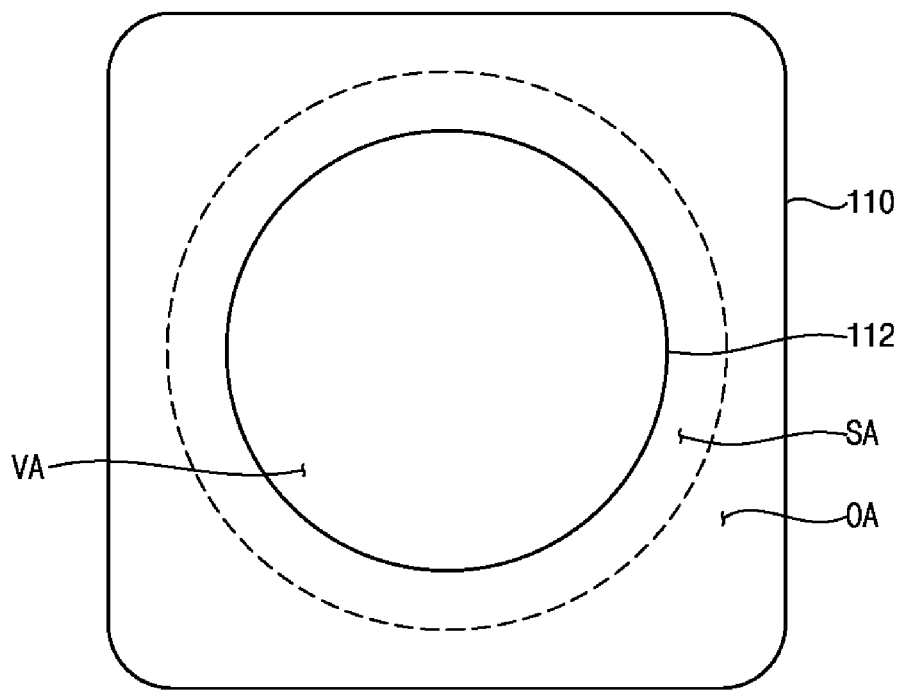
FIG. 3 is a plan view illustrating a substrate shown in FIG. 2.
Figure 4:
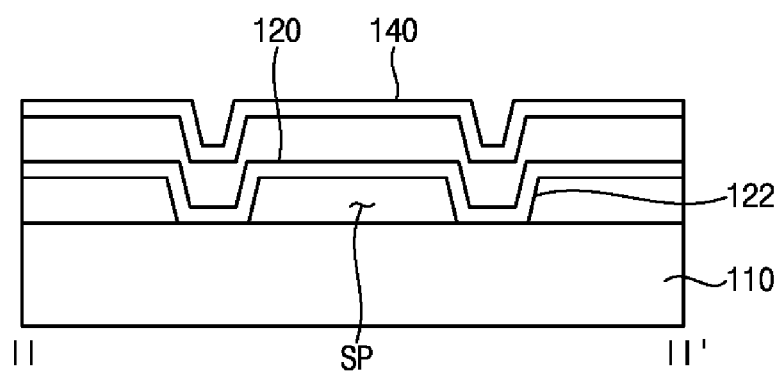
FIG. 4 is a cross sectional view taken along a line II-II' of FIG. 1.

FIG. 1 is a plan view illustrating a MEMS microphone in accordance with an example embodiment of the present invention. FIG. 2 is a cross sectional view taken along a line I-I' of FIG. 1. FIG. 3 is a plan view illustrating a substrate shown in FIG. 2. FIG. 4 is a cross sectional view taken along a line II-II' of FIG. 1.

Referring to FIGS. 1 to 3, a MEMS microphone 101 in accordance with an example embodiment of the present invention is capable of creating a displacement with responding to an acoustic pressure to convert an acoustic wave into an electrical signal and output the electrical signal. The MEMS microphone 100 includes a substrate 110, a diaphragm 120, a plurality of anchors 122, a back plate 130, and an upper insulation layer 140.

As shown in FIG. 3, the substrate 110 is divided into a vibration area VA, a supporting area SA surrounding the vibration area VA, and a peripheral area OA surrounding the peripheral area SA. In the vibration area VA of the substrate 110, a cavity 112 is formed. The cavity 112 may have a cylindrical shape.

In an example embodiment, the cavity 112 may be formed in the vibration area VA to have a shape and a size corresponding to those of the vibration area VA.

The diaphragm 120 may be disposed over the substrate 110. The diaphragm may generate a displacement which may occur due to the acoustic pressure. The diaphragm may have a membrane structure. The diaphragm 120 may cover the cavity 112. The diaphragm 120 may have a lower surface to be exposed through the cavity 112. The diaphragm 120 is bendable with responding to the acoustic pressure, and the diaphragm 120 is spaced apart from the substrate 110.

In an example embodiment, the diaphragm 120 may have a shape of a circular disc, as shown in FIG. 1

The anchors 122 are positioned at an end portion of the diaphragm 120. The anchors 122 are positioned in the supporting area SA of the substrate 110. The anchors 122 support the diaphragm 120. The anchors 122 may extend from an outer periphery of the diaphragm 120 toward the substrate 110 to space the diaphragm 120 from the substrate 110.

In an example embodiment of the present invention, the anchors 122 may be integrally formed with the diaphragm 120. Each of the anchors 122 may have the lower surface to make contact with the upper surface of the substrate 110.

In an example embodiment of the present invention, the anchors 122 are arranged along a periphery of the diaphragm 120 to be spaced apart from each other, as shown FIG. 1.

Referring to FIGS. 1 and 4, each of the anchors 120 may have a dot shape in a plan view, as shown in FIG. 1. As shown in FIG. 4, each of the anchors 122 may have a cylindrical shape. The anchors 120 may have a vertical section of a U-shape, respectively. In particular, an empty space may be formed between the anchors 122 adjacent to each other to provide a passage SP through which the acoustic pressure moves.

Referring to FIGS. 1 to 3 again, the back plate 130 may be disposed over the diaphragm 120. The back plate 140 may be disposed in the vibration area VA to face the diaphragm 120. The back plate 130 may have an arc shape, as shown in FIG. 1. The back plate 130 may have a doped portion being doped with impurities through an ion implantation process, as the diaphragm 120 has a portion corresponding to the back plate 130 to be doped with impurities.

The upper insulation layer 140 is positioned over the substrate 110 over which the back plate 130 is positioned. The upper insulation layer 140 may cover the back plate 130. Further, the upper insulation layer 140 may hold the back plate 130. Thus, the upper insulation layer 140 may space the back plate 130 from the diaphragm 120.

As shown in FIG. 2, the back plate 130 and the upper insulation layer 140 are spaced apart from the diaphragm 120 to make the diaphragm 120 freely bendable with responding to the acoustic pressure. Thus, an air gap AG is formed between the diaphragm 120 and the back plate 130.

A plurality of acoustic holes 132 may be formed through the back plate 130 such that the acoustic wave may flow through the acoustic holes 132. The acoustic holes 132 may be formed through the upper insulation layer 140 and the back plate 130 to communicate with the air gap AG.

The back plate 130 may include a plurality of dimple holes 134. Further, a plurality of dimples 144 may be positioned in the dimple holes 134. The dimple holes 134 may be formed through the back plate 130. The dimples 144 may correspond to positions at which the dimple holes 134 are formed.

The dimples 144 may prevent the diaphragm 120 from being coupled to a lower face of the back plate 130. That is, when the acoustic pressure reaches to the diaphragm 120, the diaphragm 120 can be bent in a semicircular shape toward the back plate 130, and then can return to its initial position. A bending degree of the diaphragm 120 may vary depending on a magnitude of the acoustic pressure and may be increased to such an extent that an upper surface of the diaphragm 120 makes contact with the lower surface of the back plate 130. When the diaphragm 120 is bent so much as to contact the back plate 130, the diaphragm 120 may attach to the back plate 130 and may not return to the initial position. According to example embodiments, the dimples 144 may protrude from the lower surface of the back plate 130 toward the diaphragm 120. Even when the diaphragm 164 is severely bent so much that the diaphragm 120 contacts the back plate 130, the dimples 164 may make the diaphragm 120 and the back plate 130 to be separated from each other so that the diaphragm 120 can return to the initial position.

In an example embodiment, the MEMS microphone 100 may further include a strut 142 configured to support the upper insulation layer 140. The strut 142 may be positioned in the supporting area SA. The strut 142 may make contact with the upper surface of the substrate 110. Thus, the strut 142 may support the upper insulation layer 140 to space the upper insulation layer 140 and the back plate 130 from the diaphragm 120. The strut 142 may extend from a periphery of the upper insulation layer 140 toward the substrate 110. As shown in FIG. 2, the strut 142 may include a lower surface to make contact with the lower surface of the substrate 110.

In an example embodiment, the strut 142 may be integrally formed with the upper insulation layer 140. The strut 142 may have a U-shaped vertical section, as shown in FIG. 2.

The strut 142 may be spaced in a radial direction from the diaphragm 120 and may be outwardly positioned away from the anchors 122, as shown in FIG. 2. The strut 142 may have a ring shape to surround the diaphragm 120. Here, a space between the strut 142 and the diaphragm 120 may function as a passage through which the acoustic pressure moves and may serve as a passage of an etchant in the manufacturing process of the MEMS microphone 100.

Meanwhile, the MEMS microphone 100 may further include a lower insulation layer pattern 150, a diaphragm pad 124, a sacrificial layer pattern 160, a back plate pad 136, a first pad electrode 172 and a second pad electrode 174.

In particular, the lower insulation layer pattern 150 may be formed on an upper face of the substrate 110 and may be located in the peripheral region OA. The lower insulation layer pattern 150 may be disposed on the upper surface of the substrate 110 and under the upper insulation layer 140.

The diaphragm pad 124 may be formed on an upper surface of the lower insulation layer pattern 150. The diaphragm pad 124 may be located in the peripheral region OA. The diaphragm pad 124 may be electrically connected to the diaphragm 120 and may be doped with impurities. Though not shown in detail in figures, a connection portion may be doped with impurities to connect the doped portion of the diaphragm 120 to the diaphragm pad 124.

The sacrificial layer pattern 160 may be formed on the lower insulation layer 150 on which the diaphragm pad 124 is formed, and under the upper insulation layer 140. As shown in FIG. 2, the lower insulation layer pattern 150 and the sacrificial layer pattern 160 are located in the peripheral region OA, and are disposed outside from the strut 142. Further, the lower insulation layer pattern 150 and the sacrificial layer pattern 160 may be formed using a material different from that of the upper insulation layer 140.

The back plate pad 136 may be formed on an upper face of the sacrificial layer pattern 160. The back plate pad 136 may be located in the peripheral region OA. The back plate pad 136 may be electrically connected to the back plate 140 and may be doped with impurities by in ion implantation process. Though not shown in detail in figures, a connection portion may be doped with impurities to connect the back plate 130 to the back plate pad 136.

The first and second pad electrodes 172 and 174 may be disposed on the upper insulation layer 160 and in the peripheral area OA. The first pad electrode 172 is located over the diaphragm pad 124 to make contact with the diaphragm pad 124. On other hands, the second pad electrode 174 is located over the back plate pad 136 to make contact with the back plate pad 136.

As shown in FIG. 2, a first contact hole CH1 is formed by penetrating through the upper insulation layer 140 and the sacrificial layer pattern 160 to expose the diaphragm pad 124, and the first pad electrode 172 makes contact with the diaphragm pad 124 exposed by the first contact hole CH1. Further, a second contact hole CH2 is formed by penetrating through the upper insulating layer 140 to expose the back plate pad 136, and the second pad electrode 174 is formed in the second contact hole CH2 to make contact with the back plate pad 136 exposed by the second contact hole CH2.

As described above, the MEMS microphone 100 according to example embodiments of the present invention includes the plurality of anchors 122 arranged to be spaced apart from each other for supporting the diaphragm 120, so that the diaphragm 120 is not supported by a thin film configuration such as the lower insulation layer pattern 150. Further, the anchors 122 may be integrally formed with the diaphragm 150, and an empty space may be formed between the anchors 122 adjacent to each other to provide a passage through which the acoustic pressure moves. Accordingly, a flexibility of the diaphragm 120 can be remarkably improved without lowering a rigidity of the diaphragm 120, as compared with the conventional MEMS microphone. Therefore, the diaphragm 120 may have improved sensitivity and the diaphragm 120 may be prevented from sagging.

The MEMS microphone 100 includes the strut 142 for supporting the back plate 130 and the upper insulating layer 140. The back plate 130 and the upper insulating layer 140 are not supported by a thin film configuration such as the sacrificial layer pattern 160. The strut 142 may be integrally formed with the upper insulation layer 140 and may be spaced apart from the diaphragm 120 and the anchors 122. Accordingly, the MEMS microphone 100 can further improve the flexibility of the diaphragm 120 without reducing the rigidities of the diaphragm 120 and the back plate 130.

Hereinafter, a method of manufacturing a MEMS microphone will be described in detail with reference to the drawings.

Figure 5:
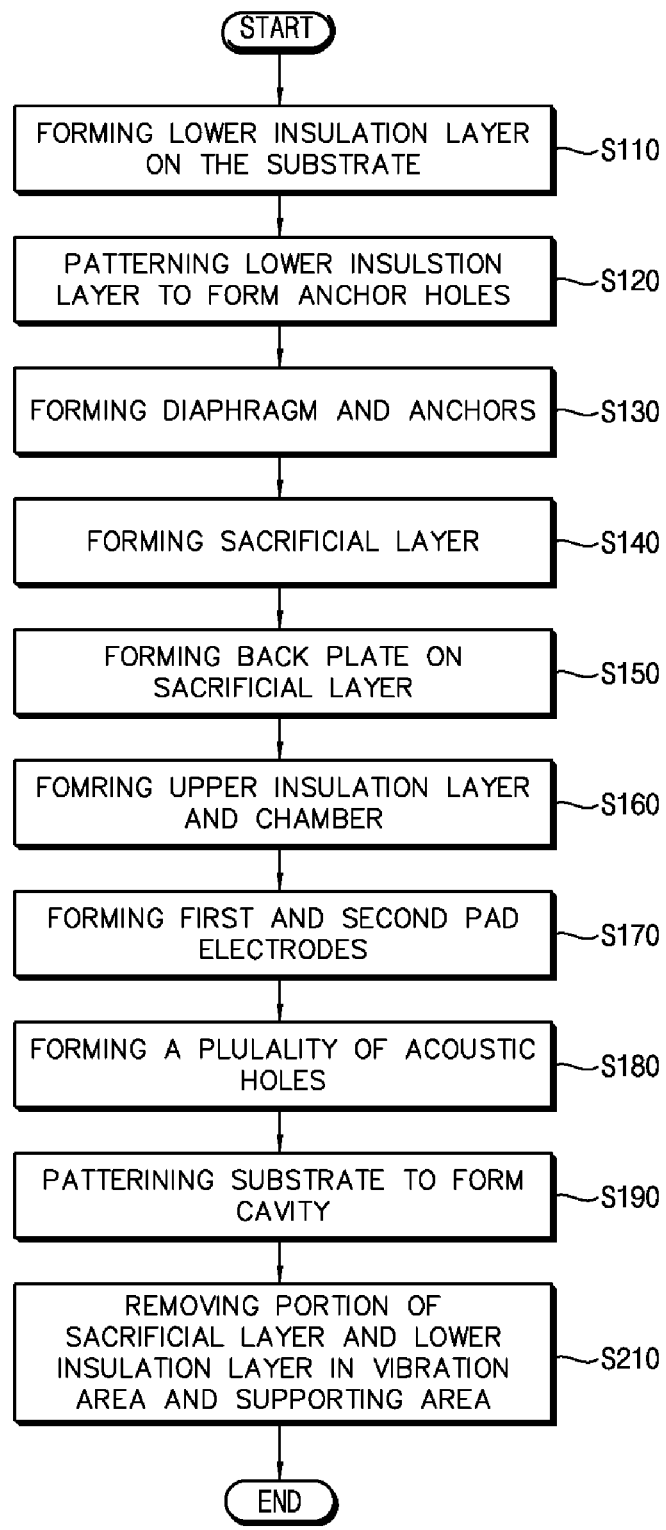
FIG. 5 is a flow chart illustrating a method of manufacturing a MEMS microphone in accordance with an example embodiment of the present invention.

FIG. 5 is a flow chart illustrating a method of manufacturing a MEMS microphone in accordance with an example embodiment of the present invention. FIGS. 6, 8 to 17 are cross sectional views illustrating a method of manufacturing a MEMS microphone in accordance with an example embodiment of the present invention. Here, FIG. 7 is a plan view illustrating a lower insulation layer pattern in FIG. 6.

Referring to FIGS. 5 to 7, according to example embodiments of a method for manufacturing a MEMS microphone, a lower insulation layer 150 is formed on a substrate 110 (step S110).

Next, the lower insulation layer 150 is patterned to form a plurality of anchor holes 152 for forming anchors 122 (see FIG. 2) (step S120), as depicted in FIG. 6. As shown in FIG. 7, the anchor holes 152 may be arranged along a periphery of the vibration area VA to be spaced apart from each other, and may be formed in a supporting area SA.

Figure 8:
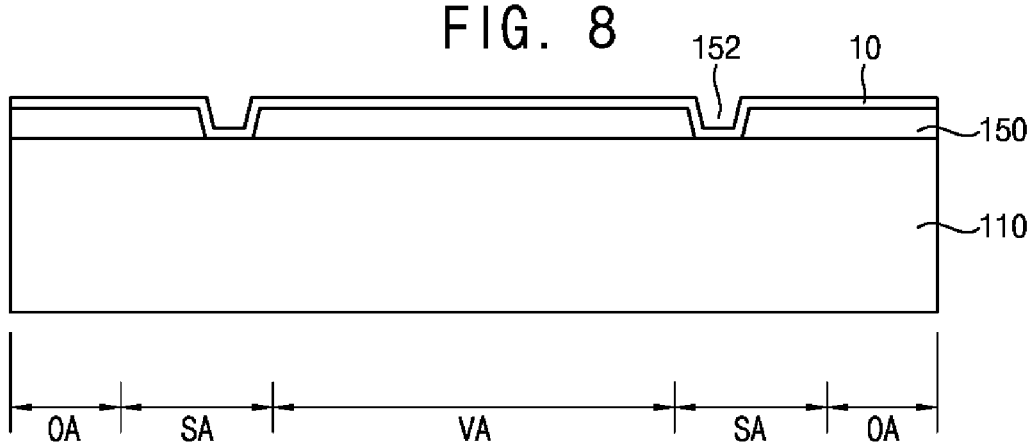
Figure 9:
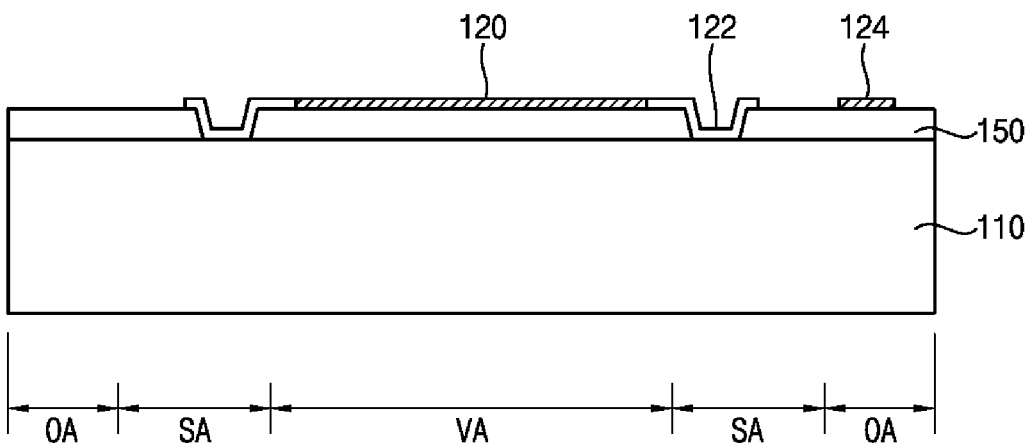

Referring to FIGS. 5, 8 and 9, a diaphragm 120 and the anchors 122 are formed on the lower insulation layer 150 (step S130).

In particular, a first silicon layer 10 is formed on the lower insulation layer 150, as shown in FIG. 8. The first silicon layer 10 may be formed using polysilicon.

Next, impurities may be doped into both a portion of the first silicon layer 10 positioned in the vibration region VA and a portion of the first silicon layer 10 to be subsequently transformed into a diaphragm pad 124 through an ion implantation process.

Then, the first silicon layer 10 is patterned to form a diaphragm 120, the anchors 122 and the diaphragm pad 124.

Figure 10:
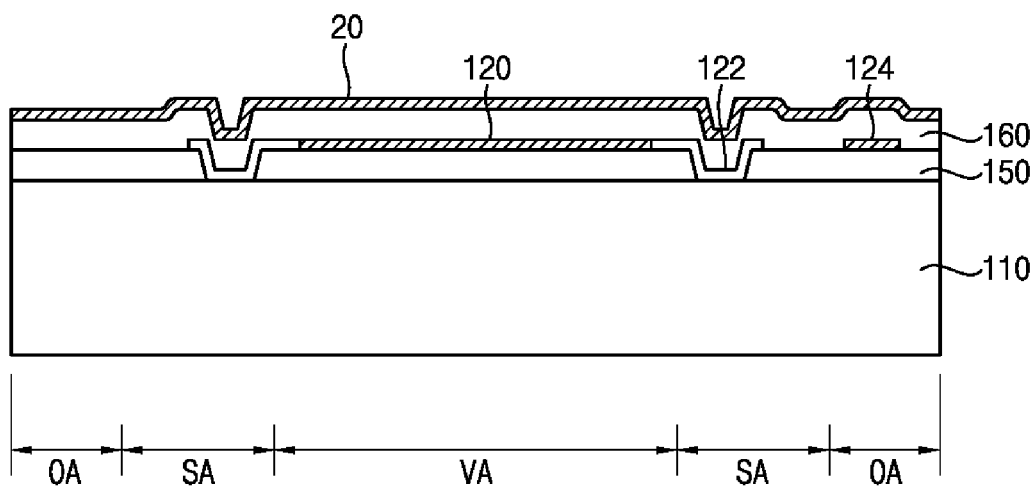

Referring to FIGS. 5 and 10, a sacrificial layer 160 is formed on the lower insulation layer 150 to cover the diaphragm 120 and the diaphragm pad 124 (step S140).

Figure 11:
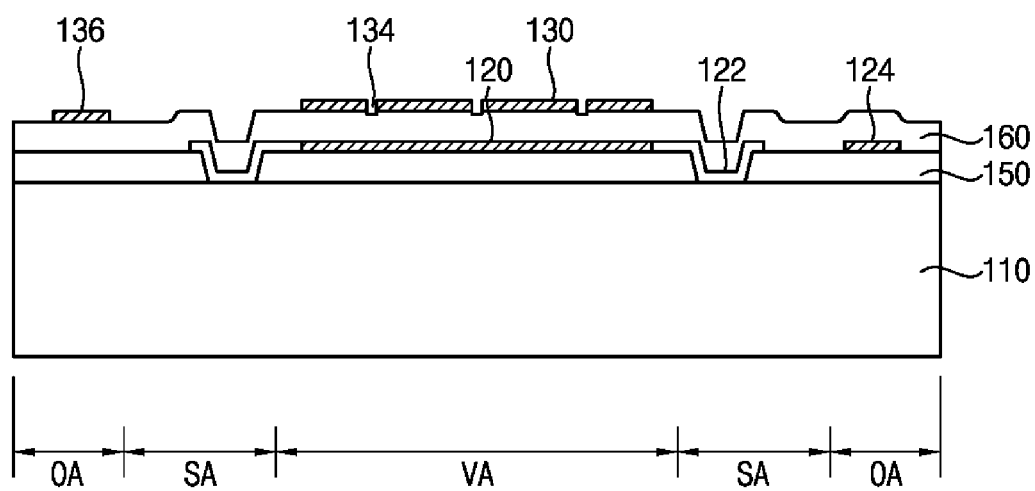

Referring to FIGS. 5 and 11, a back plate 130 is formed on the sacrificial layer 160.

In particular, a second polysilicon layer 20 is formed on an upper surface of the sacrificial layer 160. Then, impurities are doped with the second silicon layer 20 by an ion implantation process. For example, the second silicon layer 20 may be formed using polysilicon.

Next, as shown in FIG. 11, the second silicon layer 20 is patterned to form a back plate 130 and a back plate pad 136. Further, when forming the back plate 130, dimple holes 134 may be further formed, whereas acoustic holes 132 (see FIG. 2) may not be formed. A portion of the sacrificial layer 160 corresponding to the dimple holes 134 may be etched to make the dimples 144 (see FIG. 2) to protrude downwardly from a lower surface of the back plate 130.

Figure 12:
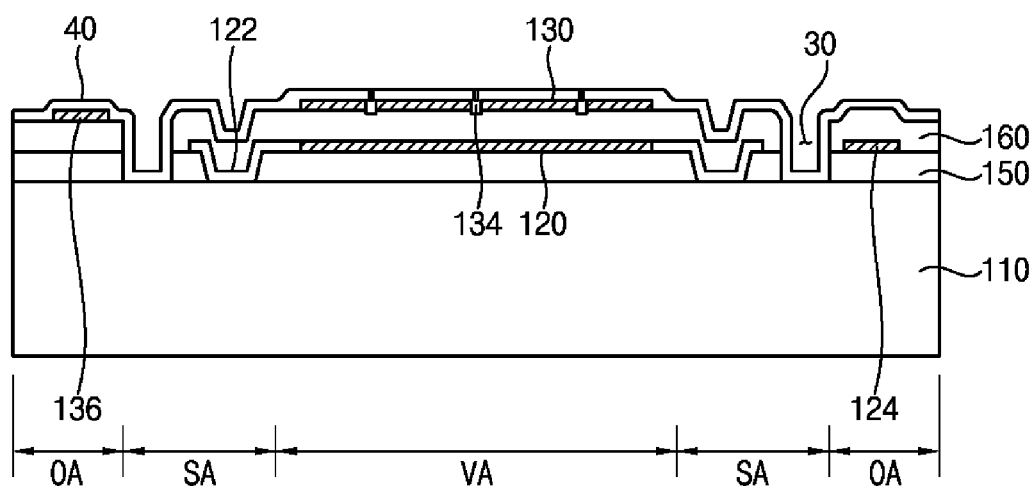
Figure 13:
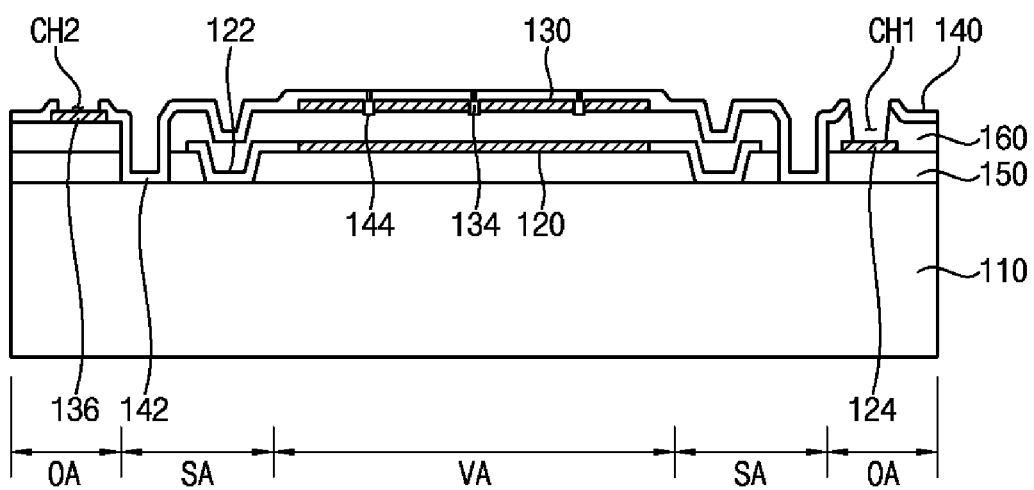

Referring to FIGS. 5, 12 and 13, an upper insulation layer 140 and a strut 142 are formed on the sacrificial layer 160 on which the back plate 130 is formed (step S160).

In particular, the sacrificial layer 160 and the lower insulation layer 150 are patterned to form a strut hole 30 in the supporting area SA for forming a strut 142. The strut hole 30 may partially expose the supporting area SA of the substrate 110.

After an insulation layer 40 is formed on the sacrificial layer 160 having the strut hole 30, the insulation layer 40 is patterned to form an upper insulation layer 140 and the strut 142, as shown in FIG. 13. Further, the dimples 144 may be further formed in the dimple holes 134 and a second contact hole CH2 is formed to expose the back plate pad 136. Furthermore, both a portion of the insulation layer 40 and a portion of the sacrificial layer 160, positioned over the diaphragm pad 124, are removed to form a first contact hole CH1.

In an example embodiment, the insulation layer 40 may be formed using a material different from those of the lower insulation layer 150 and the sacrificial layer 150. For example, the insulation layer 40 is formed using silicon nitride or silicon oxynitride, whereas the lower insulation layer 150 and the sacrificial layer 160 are formed using silicon oxide.

Figure 14:
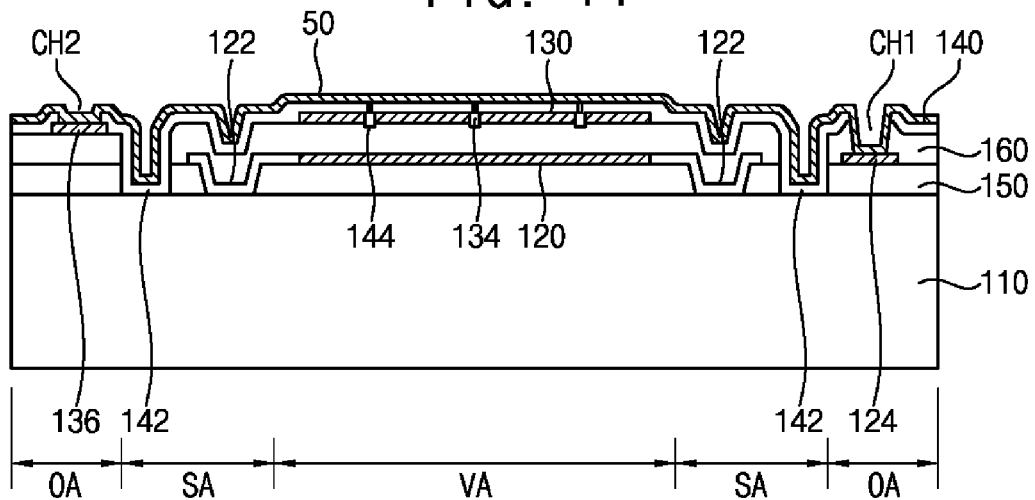
Figure 15:
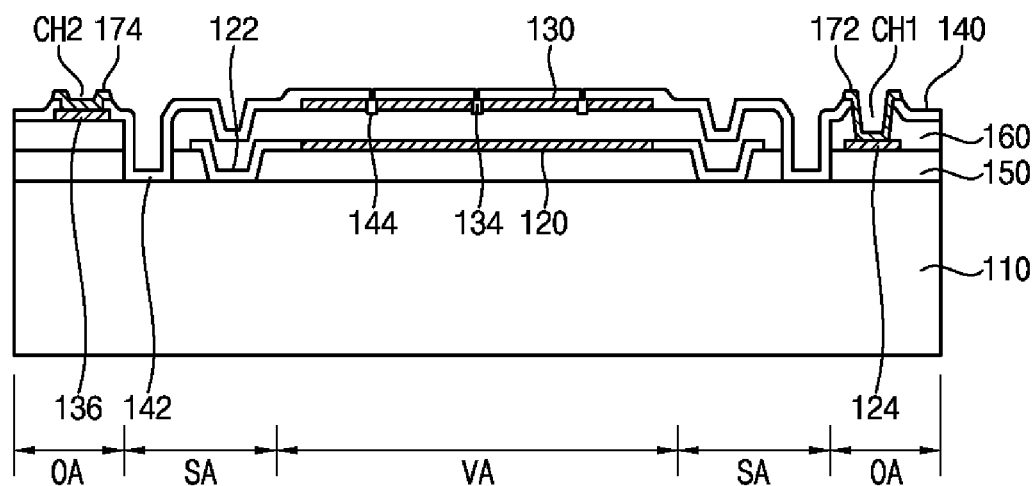

Referring to FIGS. 5, 14 and 15, after forming the first and the second contact holes CH1 and CH2, a first pad electrode 172 and a second pad electrode 174 may be formed (step S170).

In particular, a thin film 50 is formed on the upper insulation layer 140 through which the first and the second contact holes CH1 and CH2 are formed, as shown in FIG. 14. In an example embodiment, the thin film 50 may be formed using a material having a tensile force larger than that of the upper insulation layer 140. For example, the thin film 50 is formed using a conductive metal such as aluminum. Thus, a first pad electrode and a second pad electrode, which are to be formed by patterning the thin film 50, may have improved tensile force to obtain electrical conductivity securely.

Next, the thin film 50 is patterned to form a first pad electrode 172 and a second pad electrode 174, as shown in FIG. 15.

Figure 16:
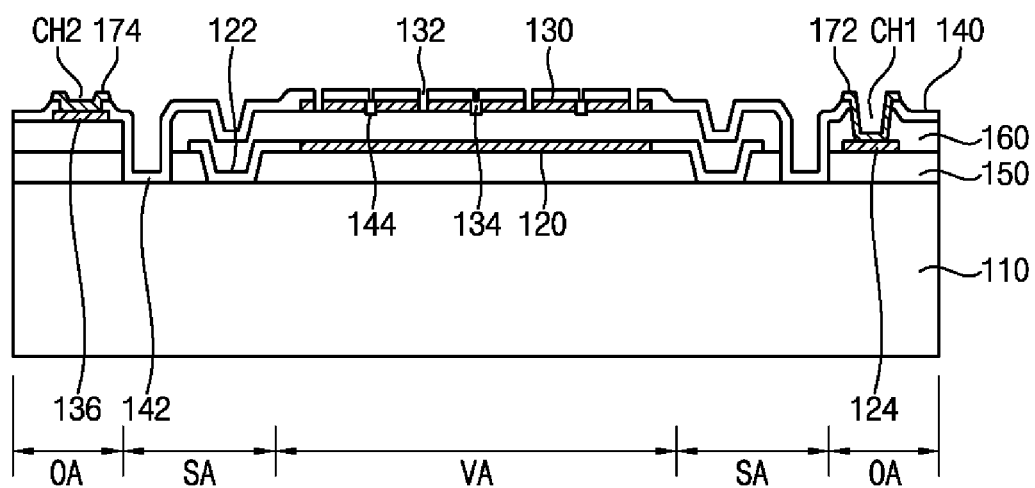

Referring to FIGS. 5 and 16, the upper insulation layer 140 and the back plate 130 are patterned to form acoustic holes 132 in the vibration area VA (step S180).

Figure 17:
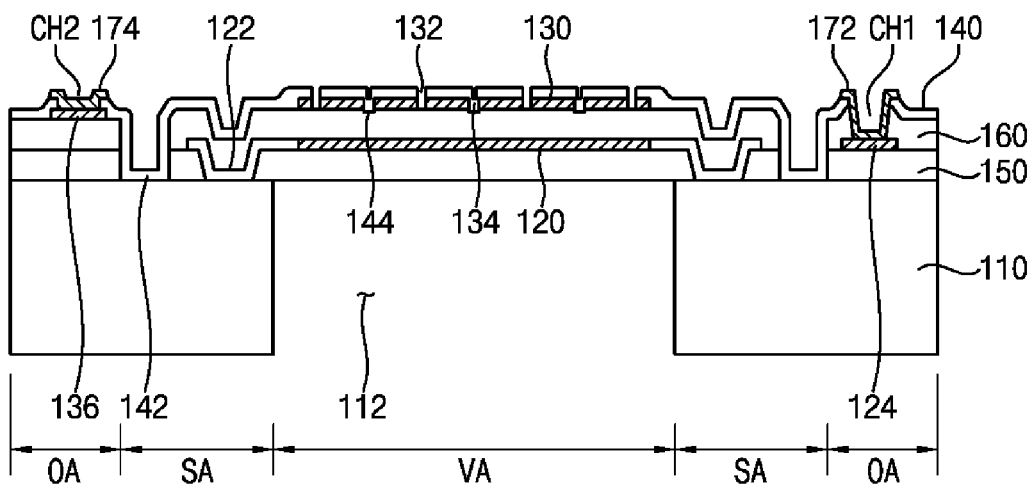

Referring to FIGS. 2, 5, and 17, after forming the acoustic holes 132, the substrate 110 is patterned to form a cavity 112 in the vibration area VA (step S190). Thus, a portion of the lower insulation layer 150 is exposed through the cavity 112.

Portions of the sacrificial layer 160 and the lower insulation layer 150, corresponding to the vibration area VA and the supporting area SA are removed through an etching process using the cavity 112 and the acoustic holes 132 (Step S210). Thus, the diaphragm 120 is exposed through the cavity 112, and an air gap AG is formed. Further, the sacrificial layer pattern and the lower insulation layer pattern are formed.

Further, portions of the lower insulation layer 150, positioned between the anchors 122 adjacent to each other, are removed to form a pathway SP (see FIG. 4) for the acoustic wave to flow. As a result, the MEMS microphone 100 as shown in FIG. 2 is manufactured.

Particularly, in step S210 of removing the sacrificial layer 160 and the lower insulation layer 150 from the vibration region VA and the support region SA, a strut 142 may be formed in the peripheral region OA to serve as a barrier layer for preventing etchant from flowing toward the peripheral area OA. Accordingly, the etching amount of the sacrificial layer 160 and the lower insulation layer 150 can be easily controlled, and the yield of the product may be improved.

In an example embodiment of the present invention, a hydrogen fluoride vapor (HF vapor) may be used as the etchant for removing the sacrificial layer 160 and the lower insulation layer 150.

As described above, according to the methods of manufacturing a MEMS microphone of the present invention, the columnar anchors 122 are formed instead of the lower insulation layer 150 in the form of a thin film for supporting the diaphragm 120, such that diaphragm 120 may have improved rigidity as well as flexibility. Further, since the anchors 122 are integrally formed together with the diaphragm 120, a separate thin film deposition process for forming the anchors 122 and a process for patterning the anchors 122 may be omitted.

In addition, the method of manufacturing the MEMS microphone according to the present invention includes forming a separate strut 142 instead of the sacrificial layer 160 in the form of a thin film to support the back plate 130. The strut 142 can be formed integrally with the upper insulation layer 140 and can be made of a different material from the lower insulation layer 150 and the sacrificial layer 160. In particular, the strut 142 is formed to surround the diaphragm 120, so that movement of the etchant into the peripheral region OA can be blocked by the strut 142. As a result, the process margin can be secured and the yield of the production can be improved.

Although the MEM microphone has been described with reference to the specific embodiments, they are not limited thereto. Therefore, it will be readily understood by those skilled in the art that various modifications and changes can be made thereto without departing from the spirit and scope of the appended claims.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112(f) of 35 U.S.C. are not to be invoked unless the specific terms "means for" or "step for" are recited in a claim.

What is claimed is:

1. A MEMS microphone comprising:
   a substrate having a cavity;
   a back plate disposed over the substrate and defining a plurality of acoustic holes;
   a diaphragm disposed between the substrate and the back plate, the diaphragm being spaced apart from the substrate and the back plate, covering the cavity to form an air gap between the back plate, and configured to generate a displacement corresponding to an applied acoustic pressure; and
   a plurality of anchors extending from an end portion of the diaphragm and integrally formed with the diaphragm, the anchors arranged along a circumference of the diaphragm and spaced apart from each other, and the plurality of anchors each having lower surfaces in contact with an upper surface of the substrate to support the diaphragm,
   wherein an empty space is formed between the anchors adjacent to each other to provide a passage through which the applied acoustic pressure can pass.

2. The MEMS microphone of claim 1, further comprising an upper insulation layer covering the back plate and holding the back plate to space the back plate from the diaphragm such that the air gap is maintained.

3. The MEMS microphone of claim 2, further comprising a strut integrally formed with the upper insulation layer, the strut provided on an outer side of at least one of the plurality of anchors, and the strut having a lower surface in contact with the upper surface of the substrate to support the upper insulation layer from the substrate such that the upper insulation layer is spaced apart from the diaphragm and the anchors.

4. The MEMS microphone of claim 3, wherein the strut is spaced from the diaphragm and the anchors, and the strut has a ring shape to surround a periphery of the diaphragm.

5. The MEMS microphone of claim 3, wherein each of the anchors and the strut has a U-shaped vertical section.

6. The MEMS microphone of claim 2, further comprising:
   a lower insulation layer pattern located on the substrate and below the upper insulation layer, the lower insulation layer pattern made of a different material than the upper insulation layer;
   a diaphragm pad disposed on the lower insulation layer pattern and connected to the diaphragm;
   a sacrificial layer pattern interposed between the lower insulation layer pattern and the upper insulation layer, the sacrificial layer pattern made of a different material than the upper insulation layer;
   a back plate pad located on the sacrificial layer pattern and connected to the back plate;
   a first pad electrode disposed on the upper insulation layer to be electrically connected to the diaphragm pad; and
   a second pad electrode disposed on the upper insulating layer to be electrically connected to the back plate pad.

7. The MEMS microphone of claim 6, wherein a first contact hole is formed through the upper insulation layer and the sacrificial layer pattern to expose the diaphragm pad, and a second contact hole is formed the upper insulation layer to expose the back plate pad.

8. The MEMS microphone of claim 1, wherein the diaphragm includes a doped portion disposed at a position corresponding to the back plate.

9. A MEMS microphone comprising:
- a substrate having a cavity, the substrate including a vibration area, a supporting area surrounding the vibration area and a peripheral area surrounding the supporting area;
- a diaphragm disposed over the vibration area of the substrate to cover the cavity, the diaphragm spaced apart from the substrate and configured to generate a displacement corresponding to an applied acoustic pressure;
- a back plate disposed over the diaphragm and in the vibration area, the back plate being spaced apart from the diaphragm to form an air gap between the diaphragm and defining a plurality of acoustic holes; and
- a plurality of anchors extending from the diaphragm toward the substrate, the anchors being disposed in the supporting area to be configured to support the diaphragm, the plurality of anchors arranged along a circumference of the vibration area and spaced apart from one another,
- wherein an empty space is formed between the anchors adjacent to each other to provide a passage through which the applied acoustic pressure can pass for communicating the cavity with the air gap.

10. The MEMS microphone of claim 9, further comprising an upper insulation layer disposed over the substrate, the upper insulation layer configured to hold the back plate.

11. The MEMS microphone of claim 10, further comprising a strut positioned in the supporting area, the strut provided at an outer side of the plurality of anchors and extending from a periphery of the upper insulation layer toward the substrate to support the upper insulation layer.

12. The MEMS microphone of claim 11, wherein the strut extends along a circumference of the vibration area.

13. The MEMS microphone of claim 10, further comprising:
- a lower insulation layer pattern located on the substrate and in the peripheral area, the lower insulation layer pattern being positioned under the upper insulation layer; and
- a sacrificial layer pattern in the peripheral area, the sacrificial layer pattern interposed between the lower insulation layer pattern and the upper insulation layer.

14. A method of manufacturing a MEMS microphone, comprising:
- forming a lower insulation layer on a substrate being divided into a vibration area, a supporting area surrounding the vibration area, and a peripheral area surrounding the supporting area;
- patterning the lower insulation layer to form a plurality of anchor holes in the supporting area for forming a plurality of anchors, the anchor holes being arranged along a circumference of the vibration area to be spaced apart from each other;
- forming a silicon layer on the lower insulation layer through which the anchor holes are formed;
- patterning the silicon layer to form a diaphragm and the anchors for supporting the diaphragm;
- forming a sacrificial layer on the lower insulation layer to cover the diaphragm and the anchors;
- forming a back plate on the sacrificial layer and in the vibration area;
- patterning the back plate to form a plurality of acoustic holes which penetrate through the back plate;
- patterning the substrate to form a cavity in the vibration area; and
- performing an etching process using the cavity and the acoustic holes to remove portions of the sacrificial layer and the lower insulation layer, located at positions corresponding the vibration area and the supporting area
- wherein the method includes forming an empty space between the anchors adjacent to each other to provide a passage through which the applied acoustic pressure can pass for communicating the cavity with the air gap.

15. The method of claim 14, further comprising:
- prior to forming the acoustic holes, patterning the sacrificial layer and the lower insulation layer to form a strut hole in the supporting region for forming a strut; and
- forming an insulating layer on the sacrificial layer on which the strut hole is formed to form an upper insulating layer for holding the back plate, and the strut for supporting the upper insulation layer.

16. The method of claim 15, wherein in forming the strut hole, the strut hole is spaced apart from the diaphragm and is formed at outer side of the anchors along the circumference of the vibration area.

17. The method of claim 16, wherein the insulation layer is made of a different material different than the lower insulation layer and the sacrificial layer, and has an etching selectivity different from the lower insulation layer and the sacrificial layer, and
while removing the portions of the lower insulation layer and the sacrificial layer in the vibration area and the supporting area, the strut suppresses an etchant from flowing into the peripheral area.

* * * * *